United States Patent
Fox, III et al.

(10) Patent No.: US 10,580,581 B2
(45) Date of Patent: Mar. 3, 2020

(54) HIGH-DENSITY METAL-INSULATOR-METAL CAPACITORS

(71) Applicant: GLOBALFOUNDRIES Inc., Grand Cayman (KY)

(72) Inventors: Robert J. Fox, III, Greenfield Center, NY (US); Lili Cheng, Rexford, NY (US); Roderick A. Augur, Saratoga Springs, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 71 days.

(21) Appl. No.: 15/815,308

(22) Filed: Nov. 16, 2017

(65) Prior Publication Data
US 2019/0148072 A1    May 16, 2019

(51) Int. Cl.
*H01G 4/30* (2006.01)
*H01G 4/252* (2006.01)
(Continued)

(52) U.S. Cl.
CPC .............. *H01G 4/30* (2013.01); *H01G 4/005* (2013.01); *H01G 4/012* (2013.01); *H01G 4/1209* (2013.01); *H01G 4/232* (2013.01); *H01G 4/252* (2013.01); *H01G 4/33* (2013.01); *H01L 28/88* (2013.01); *H01L 28/92* (2013.01)

(58) Field of Classification Search
CPC .......... H01G 4/30; H01G 4/005; H01G 4/012; H01G 4/1209; H01G 4/232; H01G 4/252; H01G 4/33
See application file for complete search history.

(56) References Cited

U.S. PATENT DOCUMENTS 7,160,772 B2    1/2007  Coolbaugh et al.
7,956,400 B2    6/2011  Smith
(Continued)

FOREIGN PATENT DOCUMENTS

TW    200807687 A    2/2008
TW    201635452 A    10/2016

OTHER PUBLICATIONS

Auth et al., "A 22nm high performance and low-power CMOS technology featuring fully-depleted tri-gate transistors, self-aligned contacts and high density MIM capacitors" VLSI Technology (VLSIT), Jun. 12-14, 2012 Symposium, Honolulu, HI.
(Continued)

*Primary Examiner* — Tucker J Wright
*Assistant Examiner* — Scott Stowe
(74) *Attorney, Agent, or Firm* — Thompson Hine LLP; Anthony Canale

(57) ABSTRACT

Methods for fabricating a structure that includes a metal-insulator-metal (MIM) capacitor and structures that include a MIM capacitor. The MIM capacitor includes a layer stack with a first electrode, a second electrode, and a third electrode. The layer stack includes a pilot opening extending at least partially through at least one of the first electrode, the second electrode, and the third electrode. A dielectric layer is arranged over the metal-insulator-metal capacitor, and includes a via opening extending vertically to the pilot opening. A via is arranged in the via opening and the pilot opening. The pilot opening has a cross-sectional area that is less than a cross-sectional area of the via opening.

19 Claims, 4 Drawing Sheets

(51) Int. Cl.
*H01G 4/005* (2006.01)
*H01G 4/12* (2006.01)
*H01L 49/02* (2006.01)
*H01G 4/012* (2006.01)
*H01G 4/33* (2006.01)
*H01G 4/232* (2006.01)

(56) References Cited

U.S. PATENT DOCUMENTS

| | | |
|---|---|---|
| 9,391,016 B2 * | 7/2016 | Shen .................. H01L 23/5223 |
| 9,461,106 B1 | 10/2016 | Yang et al. |
| 9,583,557 B2 | 2/2017 | Cheng et al. |
| 2012/0199946 A1 * | 8/2012 | Kageyama .............. H01L 28/60 |
| | | 257/532 |

OTHER PUBLICATIONS

Fischer et al., "Low-k interconnect stack with multi-layer air gap and tri-metal-insulator-metal capacitors for 14nm high volume manufacturing", Interconnect Technology Conference and 2015 IEEE Materials for Advanced Metallization Conference (IITC/MAM), 2015 IEEE International, May 18-21, 2015, Grenoble, France.

Taiwan Intellectual Property Office, Examination Report received in Application No. 107117708 dated Mar. 13, 2019 and English translation thereof.

* cited by examiner

HIGH-DENSITY METAL-INSULATOR-METAL CAPACITORS

BACKGROUND

The invention relates generally to integrated circuits and semiconductor device fabrication and, in particular, to methods for fabricating a structure that includes a metal-insulator-metal (MIM) capacitor and structures that include a MIM capacitor.

On-chip passive elements, such as MIM capacitors, are deployed in many types of integrated circuits, such as radiofrequency integrated circuits. A MIM capacitor may be integrated into one or more of the metallization levels of a back-end-of-line (BEOL) interconnect structure using materials that are commonly available in copper BEOL technologies. A two-electrode MIM capacitor includes top and bottom electrodes and a capacitor dielectric disposed between the top and bottom electrodes as an electrical insulator. The capacitance, or amount of charge held by the MIM capacitor per unit of applied voltage, depends among other factors on the area of the top and bottom electrodes, their separation, and the dielectric constant of the material constituting the capacitor dielectric.

Improved methods for fabricating a structure that includes a MIM capacitor and structures that include a MIM capacitor are needed.

SUMMARY

In an embodiment of the invention, a structure includes a metal-insulator-metal capacitor having a layer stack with a first electrode, a second electrode, and a third electrode. The layer stack includes a pilot opening extending at least partially through at least one of the first electrode, the second electrode, and the third electrode. A dielectric layer, which is arranged over the metal-insulator-metal capacitor, includes a via opening extending vertically to the pilot opening. A via is arranged in the via opening and the pilot opening. The pilot opening has a cross-sectional area that is less than a cross-sectional area of the via opening.

In an embodiment of the invention, a method includes forming a first electrode and a second electrode of a metal-insulator-metal capacitor, depositing a conductor layer over the first electrode and the second electrode, and patterning the conductor layer to form a pilot opening extending through the conductor layer to the first electrode or the second electrode. The method further includes forming a dielectric layer over the conductor layer after the conductor layer is patterned, and forming a via opening extending vertically through the dielectric layer to the pilot opening. A via is formed in the via opening and the pilot opening. The pilot opening has a cross-sectional area that is less than a cross-sectional area of the via opening.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
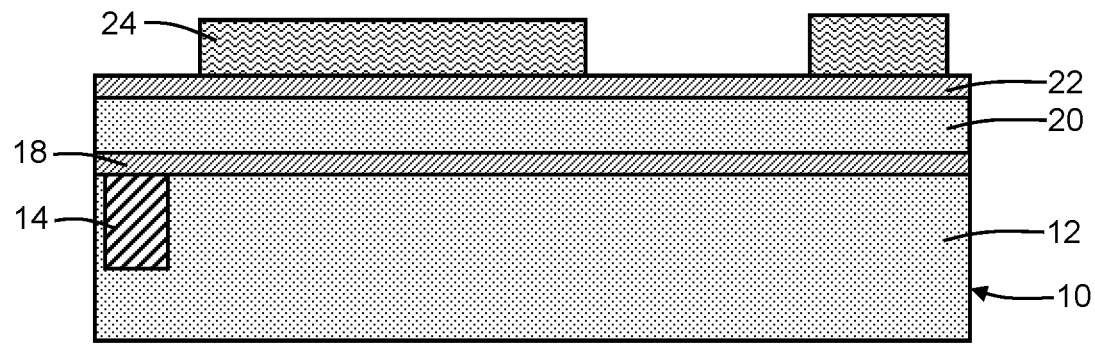
FIGS. 1-8 are cross-sectional views of a device structure at successive fabrication stages of a processing method fabricating a MIM capacitor in accordance with embodiments of the invention.

With reference to FIG. 1 and in accordance with embodiments of the invention, a back-end-of-line (BEOL) interconnect structure includes an interlayer dielectric layer 12 of a routing or metallization level 10, a wiring feature 14 embedded in the interlayer dielectric layer 12, and a capping layer 18 on the interlayer dielectric layer 12 and wiring feature 14. Additional metallization levels (not shown) may exist beneath the metallization level 10 such that the metallization level 10 is one of the upper metallization levels in the BEOL interconnect structure. The interlayer dielectric layer 12 may be comprised of an electrical insulator, such as silicon dioxide ($SiO_2$) or a low-k dielectric material. The capping layer 18 may be comprised of a nitride-based dielectric material, such as silicon nitride ($Si_3N_4$) or a low-k dielectric material. The wiring feature 14 of the metallization level 10, which may have a top surface arranged coplanar with the top surface of the interlayer dielectric layer 12, may be comprised of a metal such as copper (Cu) or cobalt (Co), with additional liner and barrier layers (e.g., tantalum nitride (TaN) or titanium nitride (TiN)) also present. The BEOL interconnect structure is carried on a die or chip (not shown) representing a section of a wafer that has been processed by front-end-of-line (FEOL) processes, such as a complementary metal-oxide-semiconductor (CMOS) process, to fabricate one or more integrated circuits that contain device structures. Conductive features in the different metallization levels of the BEOL interconnect structure function to interconnect devices of the integrated circuit and may provide circuit-to-circuit connections, or may establish contacts with input and output terminals.

A dielectric layer 20 is deposited with a given thickness on the metallization level 10 and the capping layer 18 covering the metallization level 10. In an embodiment, the dielectric layer 20 may be comprised of an electrical insulator, such as silicon dioxide ($SiO_2$) or a low-k dielectric material deposited by chemical vapor deposition (CVD).

A conductor layer 22 is deposited on a top surface of the dielectric layer 20. The conductor layer 22 may be comprised of one or more conductive materials (i.e., conductors), such as titanium nitride (TiN), tantalum nitride (TaN), tantalum (Ta), titanium (Ti), tungsten (W), tungsten nitride (WN), a layered stack of these conductive materials (e.g., a bilayer of Ti and TiN), or a combination of these conductive materials. The conductive material of conductor layer 22 may be deposited by, for example, physical vapor deposition (PVD) or chemical vapor deposition (CVD).

An etch mask 24 is formed on the top surface of the conductor layer 22. The etch mask 24 formed on the conductor layer 22 may include, for example, a bottom anti-reflective coating (BARC) layer, a spin-on hardmask, and a resist layer comprised of a photoresist material that is applied by spin coating, pre-baked, exposed to a radiation projected through a mask, baked after exposure, and developed with a chemical developer to form an opening at an intended location for a slot to be subsequently formed in the conductor layer 22.

Figure 2:
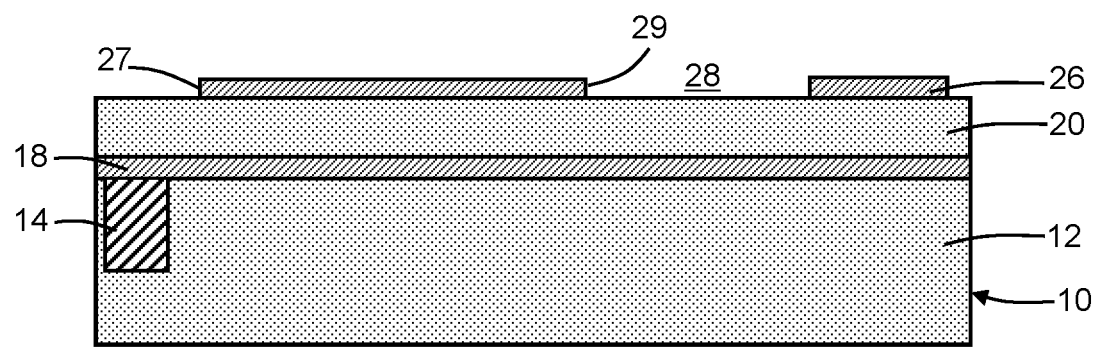
Figure 2A:
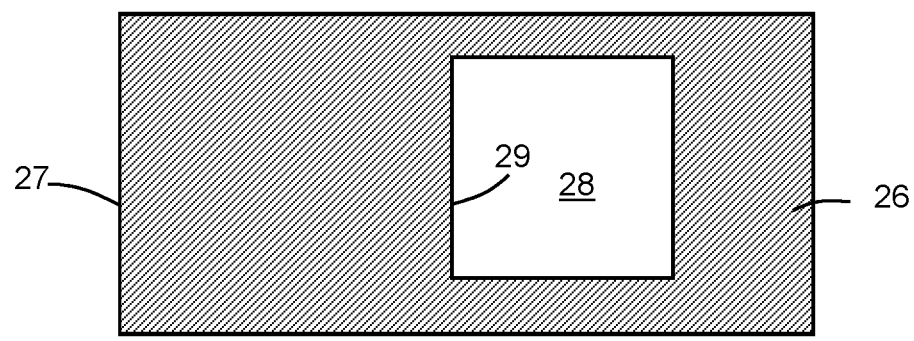
FIG. 2A is a plan view of the bottom plate of the MIM capacitor.

With reference to FIGS. 2, 2A in which like reference numerals refer to like features in FIG. 1 and at a subsequent fabrication stage, the conductor layer 22 (FIG. 1) is patterned to form a bottom plate or electrode 26 of a metal-insulator-metal (MIM) capacitor. To form the bottom electrode 26 from the conductor layer 22, the conductor layer 22 is patterned using an etching process, such as reactive ion etching (RIE), that removes the material of conductor layer 22 from areas not masked by the etch mask 24 (FIG. 1). The etching process may stop on the material of the dielectric layer 20. The etch mask 24 may be stripped following the etching process. The bottom electrode 26 includes an outer edge 27 defining its boundary and a slot 28 at the location of the opening the etch mask 24 that has an inner edge 29. The slot 28 penetrates completely through the entire thickness of the electrode 26 to the top surface of the dielectric layer 20.

Figure 3:
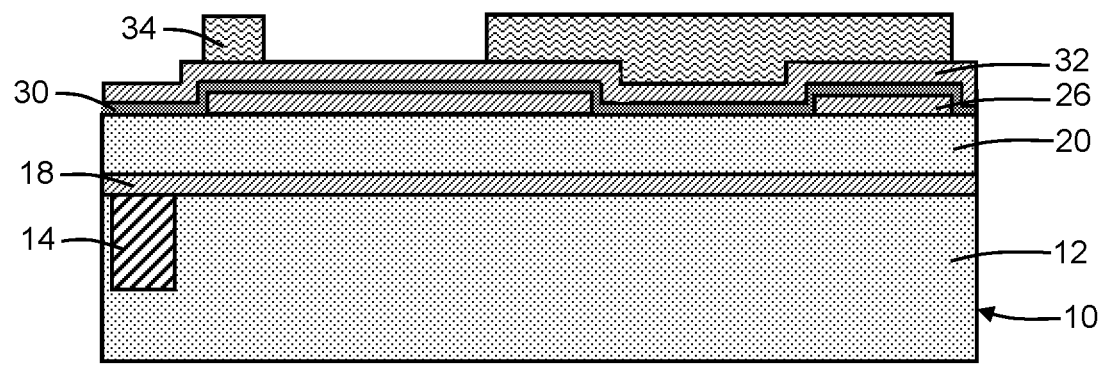

With reference to FIG. 3 in which like reference numerals refer to like features in FIG. 2 and at a subsequent fabrication stage, an insulator layer 30 is deposited on the electrode 26 and dielectric layer 20. The insulator layer 30 may be comprised of one or more dielectric materials, such as a high-k dielectric material having a dielectric constant (i.e., permittivity) greater than the dielectric constant of $SiO_2$. Suitable high-k dielectric materials for insulator layer 30 include, but are not limited to, a hafnium-based dielectric material like hafnium oxide ($HfO_2$) or doped hafnium oxide, zirconium oxide ($ZrO_2$) or doped zirconium oxide, or a layered stack of hafnium oxide or zirconium oxide and another dielectric material (e.g., aluminum oxide ($Al_2O_3$)).

A conductor layer 32 is deposited on the top surface of the insulator layer 30. The conductor layer 32 may be comprised of one or more conductive materials (i.e., conductors), such as titanium nitride (TiN), tantalum nitride (TaN), tantalum (Ta), titanium (Ti), tungsten (W), tungsten nitride (WN), a layered stack of these conductive materials (e.g., a bilayer of Ti and TiN), or a combination of these conductive materials. The conductive material of conductor layer 32 may be deposited by, for example, physical vapor deposition (PVD) or chemical vapor deposition (CVD). In an embodiment, the conductor layer 32 may be composed of the same conductor as the conductor layer 22.

An etch mask 34 is formed on the top surface of the conductor layer 32. The etch mask 34 formed on the conductor layer 32 may include, for example, a bottom anti-reflective coating (BARC) layer, a spin-on hardmask, and a resist layer comprised of a photoresist material that is applied by spin coating, pre-baked, exposed to a radiation projected through a mask, baked after exposure, and developed with a chemical developer to form an opening at an intended location for a slot to be subsequently formed in the conductor layer 32.

Figure 4:
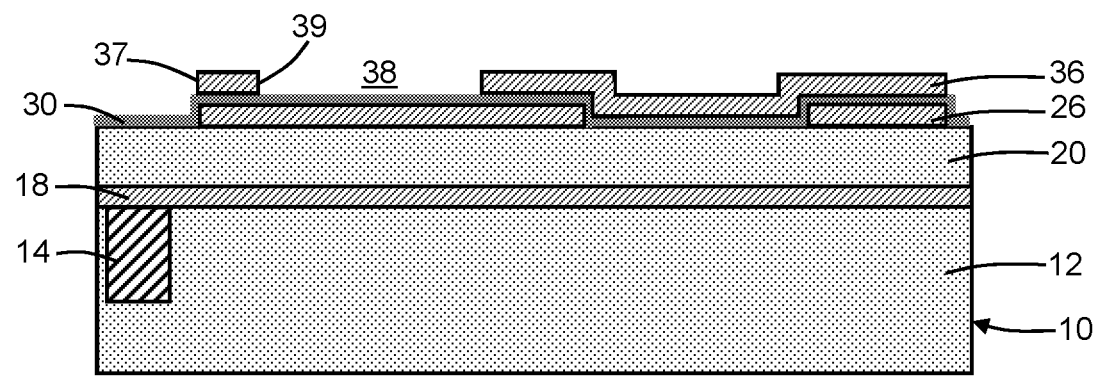
Figure 4A:
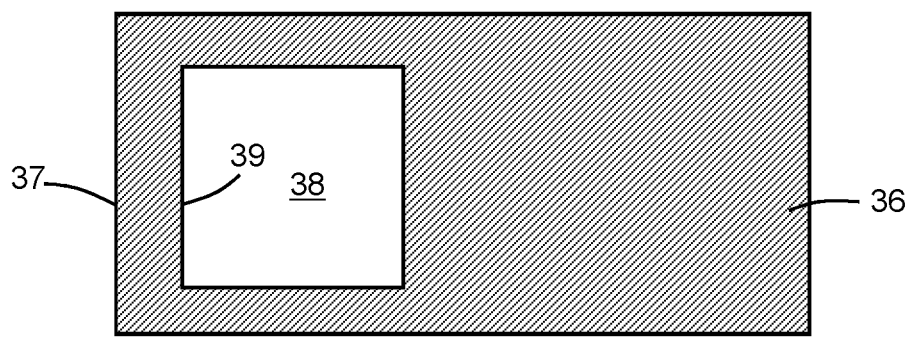
FIG. 4A is a plan view of the middle plate of the MIM capacitor.

With reference to FIGS. 4, 4A in which like reference numerals refer to like features in FIG. 3 and at a subsequent fabrication stage, the conductor layer 22 (FIG. 3) is patterned to form a middle plate or electrode 36 of the metal-insulator-metal (MIM) capacitor. To form the middle electrode 36 from the conductor layer 32, the conductor layer 32 is patterned using an etching process, such as reactive ion etching (RIE), that removes the material of conductor layer 32 from areas not masked by the etch mask 24 (FIG. 1). The etching process may stop on the material of the insulator layer 30. The etch mask 34 may be stripped following the etching process.

The middle electrode 36 includes an outer edge 37 defining its boundary and a slot 38 at the location of the opening in the etch mask 34 that has an inner edge 39. The slot 38 penetrates completely through the entire thickness of the middle electrode 36 to the top surface of the insulator layer 30. The slot 38 is offset from the slot 28 in the electrode 26 such that the slots 28, 38 do not overlap. A portion of the middle electrode 36 is located on the insulator layer 30 inside the slot 28 in the electrode 26.

Figure 5:
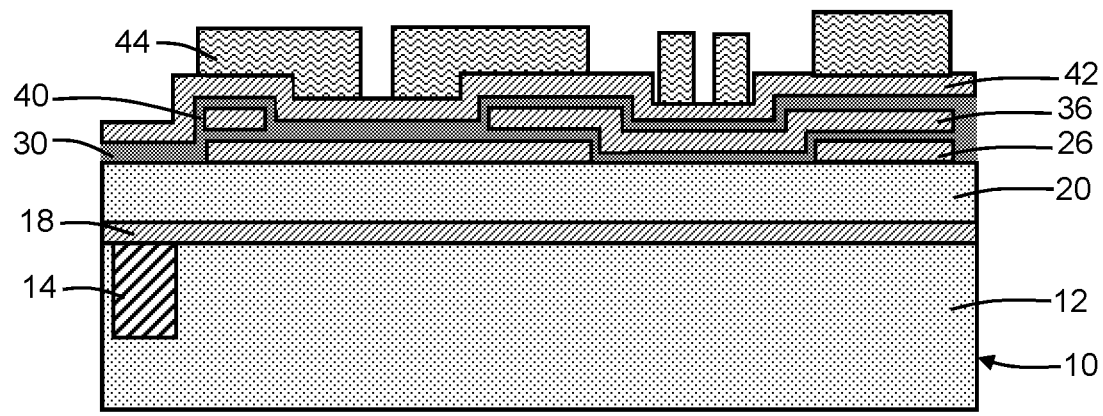

With reference to FIG. 5 in which like reference numerals refer to like features in FIG. 4 and at a subsequent fabrication stage, an insulator layer 40 is deposited on the middle electrode 36 and insulator layer 30. The insulator layer 40 may be comprised of one or more dielectric materials, such as a high-k dielectric material having a dielectric constant (i.e., permittivity) greater than the dielectric constant of $SiO_2$. Suitable high-k dielectric materials for insulator layer 40 include, but are not limited to, a hafnium-based dielectric material like hafnium oxide ($HfO_2$) or doped hafnium oxide, zirconium oxide ($ZrO_2$) or doped zirconium oxide, or a layered stack of hafnium oxide or zirconium oxide and another dielectric material (e.g., aluminum oxide ($Al_2O_3$)). In an embodiment, the insulator layers 30, 40 may be composed of the same dielectric material(s).

A conductor layer 42 is deposited on the top surface of the insulator layer 40. The conductor layer 42 may be comprised of one or more conductive materials (i.e., conductors), such as titanium nitride (TiN), tantalum nitride (TaN), tantalum (Ta), titanium (Ti), tungsten (W), tungsten nitride (WN), a layered stack of these conductive materials (e.g., a bilayer of Ti and TiN), or a combination of these conductive materials. The conductive material of conductor layer 42 may be deposited by, for example, physical vapor deposition (PVD) or chemical vapor deposition (CVD). In an embodiment, the conductor layer 42 may be composed of the same conductor as the conductor layers 22 and 32.

An etch mask 44 is formed on the top surface of the conductor layer 42. The etch mask 44 formed on the conductor layer 42 may include, for example, a bottom anti-reflective coating (BARC) layer, a spin-on hardmask, and a resist layer comprised of a photoresist material that is applied by spin coating, pre-baked, exposed to a radiation projected through a mask, baked after exposure, and developed with a chemical developer to form openings at intended locations for a slot and pilot openings to be subsequently formed in the conductor layer 42.

Figure 6:
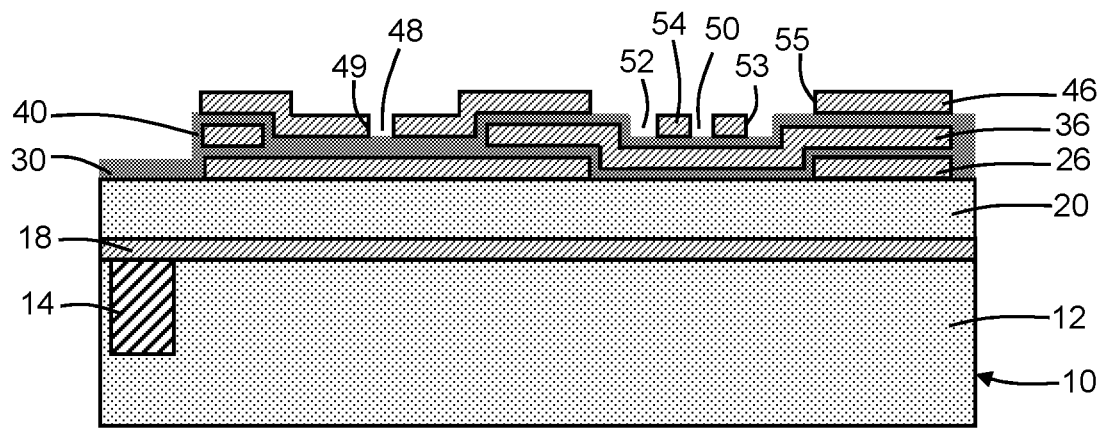
Figure 6A:
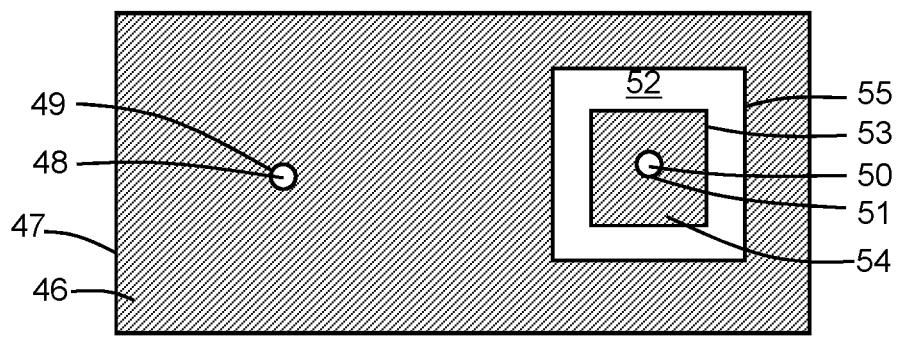
FIG. 6A is a plan view of the top plate of the MIM capacitor.

With reference to FIGS. 6, 6A in which like reference numerals refer to like features in FIG. 5 and at a subsequent fabrication stage, the conductor layer 42 (FIG. 3) is patterned to form a top plate or electrode 46 of the metal-insulator-metal (MIM) capacitor and a collar 54. To form the top electrode 46 and collar 54 from the conductor layer 42, the conductor layer 42 is patterned using an etching process, such as reactive ion etching (RIE), that removes the material of conductor layer 42 from areas not masked by the etch mask 44 (FIG. 5). The etching process may stop on the material of the insulator layer 40. The etch mask 44 may be stripped following the etching process.

The top electrode 46 includes an outer edge 47 defining its boundary established at its outer perimeter, as well as pilot openings 48, 50 and a slot 52. The collar 54 is defined as a section of the conductor of the conductor layer 42 that is arranged inside the slot 52 and on the insulator layer 40 over a section of the middle electrode 36 aligned with the slot 52 and the slot 28 in the bottom electrode 26. The collar 54 is electrically and physically disconnected from the top electrode 46 and represents a dummy shape that is associated with the MIM capacitor. The insulator layers 30, 40 provide capacitor dielectric layers arranged between the electrodes 26, 36, 46.

The pilot opening 48 penetrates completely through the entire thickness of the top electrode 46 to the insulator layer 40 on the bottom electrode 26. The pilot opening 50 penetrates completely through the entire thickness of the collar 54 to the insulator layer 40 on the middle electrode 36. The pilot opening 48 has an inner edge 49 defining its boundary, and the pilot opening 50 has an inner edge 51 defining its boundary. The slot 52 also penetrates completely through the entire thickness of the top electrode 46 to the insulator layer 40 on the middle electrode 36.

The collar 54 has an outer edge 53 that is spaced inward from an inner edge 55 of the slot 52. The slot 52 may be aligned with the slot 28 in the electrode 26 such that the slots 28 and 52 have an overlapping relationship. In an embodiment, the slot 28, 52 may be centered and the slot 52 in the top electrode 46 may be sized to be slightly larger than the slot 28 in the bottom electrode 26. A section of the top electrode 46 is positioned on the insulator layer 40 inside the slot 38 extending through the middle electrode 36, which permits the bottom electrode 26 and the top electrode 46 to be contacted from above and coupled together by the same via.

Figure 7:
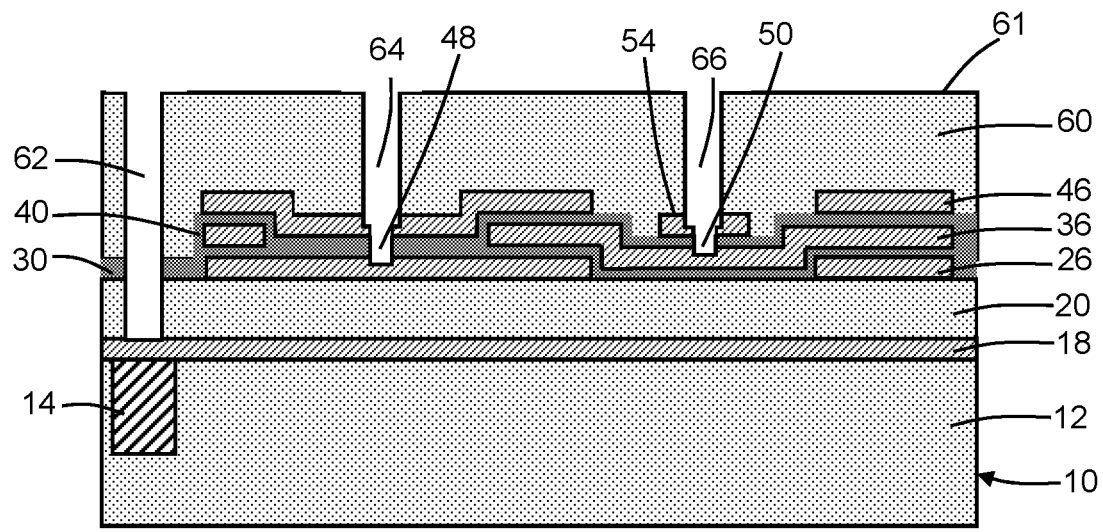
Figure 7A:
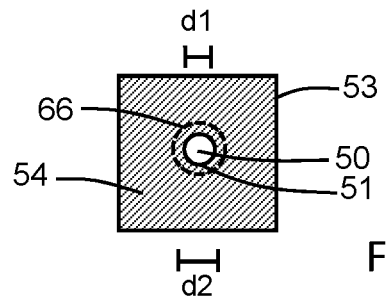
FIG. 7A is an enlarged plan view of a portion of FIG. 7 showing the collar, its pilot opening, and a projection of the via opening for a size comparison with the pilot opening.

With reference to FIGS. 7, 7A in which like reference numerals refer to like features in FIGS. 6, 6A and at a subsequent fabrication stage, a dielectric layer 60 is deposited and planarized using chemical-mechanical polishing (CMP). In an embodiment, the dielectric layer 60 may be comprised of an electrical insulator, such as silicon dioxide (SiO$_2$). A patterned resist layer (not shown) may be applied on dielectric layer 60 and used to pattern the via openings 62, 64, 66 with one or more etching processes, such as reactive ion etching (RIE) processes.

The via opening 62 extends from a top surface 61 of the dielectric layer 60 through the dielectric layers 20, 60 and the insulator layers 30, 40 on dielectric layer 20 to the capping layer 18 on the interlayer dielectric layer 12 over an area above the wiring feature 14. The via opening 64 extends from the top surface 61 of the dielectric layer 60 through the dielectric layer 60 and the insulator layers 30, 40 exposed inside the pilot opening 48 and into the top electrode 46. The via opening 64 may extend partially through the top electrode 46, and the etching process forming the via opening 64 may etch the bottom electrode 26 through the pilot opening 48 in a self-aligned manner so that the pilot opening 48 is extended into, and partially through, the bottom electrode 26. The via opening 66 extends from the top surface 61 of the dielectric layer 60 through the dielectric layer 60 and the insulator layer 40 exposed inside the pilot opening 48 and into the middle electrode 36. The via opening 66 may extend partially through the collar 54, and the etching process forming the via opening 66 may etch the middle electrode 36 through the pilot opening 48 in a self-aligned manner so that the pilot opening 48 is extended into, and partially through, the middle electrode 36.

As best shown in FIG. 7A, the critical dimension (e.g., diameter d1) and cross-sectional area of the pilot opening 50 are less than the critical dimension (e.g., diameter d2) and cross-sectional area of the via opening 66 extending vertically from above to the pilot opening 50. Similarly, the critical dimension (e.g., diameter d1) and cross-sectional area of the pilot opening 48 are less than the critical dimension (e.g., diameter d2) and cross-sectional area of the via opening 64 extending vertically from above to the pilot opening 48. The smaller diameter of the pilot openings 48, 50 in comparison with the diameter of the via openings 64, 66 slows the local etch rate of the via etching process in the electrodes 26, 36, 46 during the overetch that extends the via opening 62 completely through the dielectric layer 20 to the capping layer 18 above the wiring feature 14.

The slot 38 in the middle electrode 36 is dimensioned to be larger in cross-sectional area than the cross-sectional area of the via opening 66. The slot 28 in the bottom electrode 26 and the slot 52 in the top electrode 46 are each dimensioned to be larger in cross-sectional area than the cross-sectional area of the via opening 64.

Figure 8:
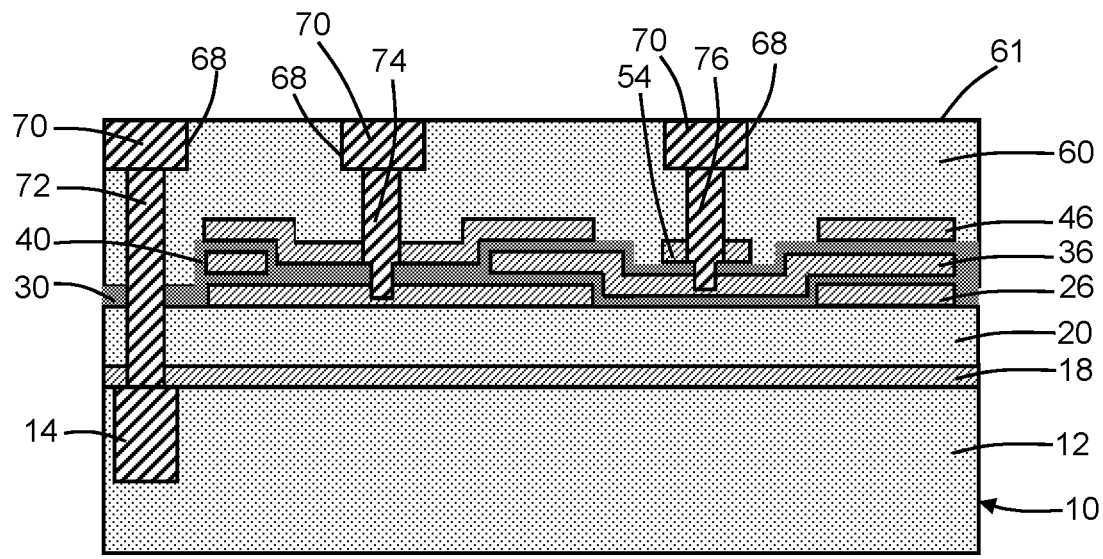

With reference to FIG. 8 in which like reference numerals refer to like features in FIG. 7 and at a subsequent fabrication stage, the dielectric layer 60 is patterned to form trenches 68 arranged above the via openings 62, 64, 66 as part of a dual damascene process. A patterned resist layer (not shown) may be applied on dielectric layer 60 and used to pattern the trenches 68 with one or more etching processes, such as reactive ion etching (RIE) processes.

The one or more etching processes may also be used to extend the via opening 62 through the capping layer 18 to the wiring feature 14. The one or more etching processes may also extend the via opening 64 further into the top electrode 46 and, in the representative embodiment, may extend the via opening 64 through the top electrode 46 to the insulator layer 40. The one or more etching processes may also extend the via opening 66 further into the collar 54, and, in the representative embodiment, may extend the via opening 66 through the collar 54 to the insulator layer 40. The one or more etching processes may also extend the pilot opening 48 further into but not through (i.e., only partially through) the bottom electrode 26, and extend the pilot opening 50 further into but not through (i.e., only partially through) the middle electrode 36. Even if the overetching were to extend the pilot opening 48 completely through the bottom electrode 26 and/or extend the pilot opening 50 completely through the middle electrode 36, the pilot openings 48, 50 would merely penetrate in each instance to a shallow depth into the dielectric layer 20 underlying the MIM capacitor and would not approach the underlying metallization level 10.

Wiring features 70 are formed inside the trenches 68, and vias 72, 74, 76 are respectively formed inside the via openings 62, 64, 66 and pilot openings 48, 50 to provide a routing or metallization level over the metallization level 10. The wiring features 70 and vias 72, 74, 76 may be comprised of a conductor such as copper (Cu), cobalt (Co), and other similar metals, with additional liner and barrier layers (e.g., tantalum nitride (TaN) or titanium nitride (TiN)) also present. The conductor may be formed by an electrochemical deposition process, such as electroplating or electroless plating.

A chemical-mechanical polishing (CMP) process may be used to remove excess barrier/liner material and conductor from the top surface 61 of dielectric layer 60 and to planarize the wiring features 70 to be flush with the top surface 61 of dielectric layer 60. The via 72 electrically and physically connects one of the wiring features 70 with the wiring feature 14. The via 74 electrically and physically connects the bottom electrode 26 and the top electrode 46 of the MIM capacitor together and with one of the wiring features 70. The via 76 electrically and physically connects the middle electrode 36 of the MIM capacitor with another of the wiring features 70.

The electrodes 26, 36, 46 of the MIM capacitor are positioned within a via vertical space that is arranged vertically between the metallization level 10 and the trenches 68 of the metallization level overlying the metallization level 10. The electrodes 26, 36, 46 of the MIM capacitor are top-contacted by the vias 74, 76, and are inserted in the via vertical space between the pair of upper metallization levels of the BEOL interconnect structure. In addition, the electrodes 26, 36, 46 of the MIM capacitor can be placed higher in the via vertical space and further from the lower metallization level 10, which may reduce capacitive coupling in comparison with conventional three-electrode MIM capacitors due to the increased distance and thickened dielectric layer 20.

The top electrode 46 and bottom electrode 26 are connected together by the via 74 to form one pole of the MIM capacitor, and the middle electrode 36 forms the other pole of the MIM capacitor. The different poles of the MIM capacitor are contacted by the vias 74, 76 landing on the electrodes 26, 36, 46 from above (i.e., "top contacted"), which can provide low contact resistance. The reduced diameter of the pilot opening 48 reduces the rate of the via etch forming via opening 64 so that the via etch stops inside the bottom electrode 26 without full penetration or, alternatively, stops close to the underside of the bottom electrode 26. In this way, the via etch is stopped without approaching the metallization level 10 below the electrodes 26, 36, 46 of the MIM capacitor, which eliminates the need for any type of underlying via landing pads beneath the MIM capacitor and the dielectric layer 20. To increase the manufacturability margin, the collar 54, which is patterned from the conductor layer 42 used to form the top electrode 46 and which includes another reduced-diameter pilot opening 50, is placed above the middle electrode 36 over the location where via contact to the middle electrode 36 is made by via 76. Similar to the pilot opening 48, the pilot opening 50 provides a reduction in the rate in the via etch of via opening 66.

The top electrode 46 and bottom electrode 26 are coupled together by the via 74, and the middle electrode 36 is coupled to another via 76. The electrodes 26, 36, 46 are arranged such as to form a pair of two-electrode MIM capacitors that are connected in parallel such that the effective capacitance is equal to the sum of the individual capacitances, which doubles the available capacitance and capacitance density compared to a two-electrode MIM capacitor without changing the passive device footprint. In an embodiment, additional layers providing electrode pairs may be added to the construction of the MIM capacitor to further increase the available capacitance and capacitance density.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", "lateral", etc. are made by way of example, and not by way of limitation, to establish a frame of reference. Terms such as "horizontal" and "lateral" refer to a direction in a plane parallel to a top surface of a semiconductor substrate, regardless of its actual three-dimensional spatial orientation. Terms such as "vertical" and "normal" refer to a direction perpendicular to the "horizontal" and "lateral" direction. Terms such as "above" and "below" indicate positioning of elements or structures relative to each other and/or to the top surface of the semiconductor substrate as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising: a metal-insulator-metal capacitor including a layer stack with a first electrode, a second electrode, and a third electrode, the second electrode including a first portion and a second portion, the layer stack including a first pilot opening extending at least partially through the first portion of the second electrode, and the second portion of the second electrode arranged vertically between the first electrode and the third electrode; a collar arranged over the first portion of the second electrode; a first dielectric layer over the metal-insulator-metal capacitor, the first dielectric layer including a first via opening extending to the first pilot opening, and the first via opening extending at least partially through the collar; and a first via in the first via opening and the first pilot opening, wherein the first via opening has a cross-sectional area, and the first pilot opening has a cross-sectional area that is less than the cross-sectional area of the first via opening.

2. The structure of claim 1 further comprising:
a metallization level arranged beneath the layer stack; and
a second dielectric layer vertically arranged between the layer stack and the metallization level,
wherein the first pilot opening extends fully through the first portion of the second electrode and to a given depth into the second dielectric layer.

3. The structure of claim 1 wherein the collar is comprised of a conductor.

4. The structure of claim 1 wherein the first via opening extends fully through the collar.

5. The structure of claim 1 wherein the first via opening extends partially through the collar, and the first pilot opening extends in part through the collar.

6. The structure of claim 1 wherein the layer stack further includes a first capacitor dielectric and a second capacitor dielectric, the first capacitor dielectric is arranged between the first electrode and the second electrode, the second capacitor dielectric is arranged between the second electrode and the third electrode, and the first capacitor dielectric and the second capacitor dielectric are comprised of a high-k dielectric material.

7. The structure of claim 1 wherein the first electrode includes a first slot, the third electrode includes a second slot that overlaps with the first slot, and the collar, the first pilot opening, and the first via opening are arranged within a boundary of the first slot and a boundary of the second slot.

8. The structure of claim 1 wherein the layer stack includes a second pilot opening that extends at least partially through the first electrode, the first dielectric layer includes a second via opening extending to the second pilot opening, the second via opening has a cross-sectional area, and the second pilot opening has a cross-sectional area that is less than the cross-sectional area of the second via opening.

9. The structure of claim 8 further comprising:
a second via in the second via opening and the second pilot opening.

10. The structure of claim 9 wherein the second pilot opening extends completely through the third electrode, and the third electrode and the first electrode are connected by the second via.

11. The structure of claim 1 further comprising:
a routing level; and
a second dielectric layer on the routing level,
wherein the metal-insulator-metal capacitor is arranged vertically between the first dielectric layer and the second dielectric layer, and the first via opening terminates in the layer stack and above a top surface of the second dielectric layer.

12. A structure comprising:
a metal-insulator-metal capacitor including a layer stack with a first electrode, a second electrode, and a third electrode, the layer stack including a pilot opening extending completely through the third electrode and at least partially through the first electrode;
a first dielectric layer over the metal-insulator-metal capacitor, the first dielectric layer including a via opening extending to the pilot opening; and
a via in the via opening and the pilot opening,
wherein the third electrode and the first electrode are connected by the via, the via opening has a cross-sectional area, the pilot opening has a cross-sectional area that is less than the cross-sectional area of the via opening, the second electrode includes a slot, and the slot has a boundary that surrounds the pilot opening and the via opening.

13. The structure of claim 12 further comprising:
a metallization level arranged beneath the layer stack; and
a second dielectric layer vertically arranged between the layer stack and the metallization level in a vertical direction,
wherein the pilot opening extends fully through the first electrode and to a given depth into the second dielectric layer.

14. The structure of claim 12 wherein the layer stack further includes a first capacitor dielectric and a second capacitor dielectric, the first capacitor dielectric is arranged between the first electrode and the second electrode, the second capacitor dielectric is arranged between the second electrode and the third electrode, and the first capacitor dielectric and the second capacitor dielectric are comprised of a high-k dielectric material.

15. A method comprising:
forming a first electrode and a second electrode of a metal-insulator-metal capacitor;
depositing a conductor layer over the first electrode and the second electrode;
patterning the conductor layer to form a collar arranged over a first portion of the second electrode and a first pilot opening extending through the collar and at least partially through the second electrode;
after patterning the conductor layer, forming a dielectric layer over the collar;
forming a first via opening extending through the dielectric layer to the first pilot opening and at least partially through the collar; and
forming a first via in the first via opening and the first pilot opening,
wherein the first via opening has a cross-sectional area, and the first pilot opening has a cross-sectional area that is less than the cross-sectional area of the first via opening.

16. The method of claim 15 wherein patterning the conductor layer further comprises:
forming a third electrode arranged over a second portion of the second electrode.

17. The method of claim 16 wherein the first electrode includes a first slot, the third electrode includes a second slot that overlaps with the first slot, and the collar and the first pilot opening are arranged within a boundary of the first slot and a boundary of the second slot.

18. The method of claim 16 wherein patterning the conductor layer comprises:
forming a second pilot opening extending through the third electrode.

19. The method of claim 18 further comprising:
forming a second via opening extending through the dielectric layer to the second pilot opening; and
forming a second via in the second via opening and the second pilot opening,
wherein the second via opening has a cross-sectional area, and the second pilot opening has a cross-sectional area that is less than the cross-sectional area of the second via opening, the second electrode includes a slot that surrounds the second pilot opening, the second pilot opening is extended to and at least partially through the first electrode when forming the second via opening, and the second via connects the third electrode with the first electrode.

* * * * *